United States Patent
Wang et al.

[11] Patent Number: 5,831,899
[45] Date of Patent: Nov. 3, 1998

[54] LOCAL INTERCONNECT STRUCTURE AND PROCESS FOR SIX-TRANSISTOR SRAM CELL

[75] Inventors: Pailu Wang, San Jose; Chuen-Der Lien, Los Altos Hills; Kyle W. Terrill, Campbell, all of Calif.

[73] Assignee: Integrated Device Technology, Inc., Santa Clara, Calif.

[21] Appl. No.: 841,985

[22] Filed: Apr. 7, 1997

[51] Int. Cl.$^6$ .................................................. G11C 11/00
[52] U.S. Cl. .................... 365/156; 257/377; 257/382; 257/903
[58] Field of Search .................... 257/377, 382, 257/903; 365/156

[56] References Cited

U.S. PATENT DOCUMENTS

| | | | |
|---|---|---|---|
| 5,404,030 | 4/1995 | Kim et al. ................................. | 257/67 |
| 5,471,071 | 11/1995 | Yoshihara ................................. | 257/69 |
| 5,536,962 | 7/1996 | Pfiester ................................... | 257/392 |
| 5,616,934 | 4/1997 | Dennison et al. ......................... | 257/67 |
| 5,654,572 | 8/1997 | Kawase .................................... | 257/371 |
| 5,670,812 | 9/1997 | Adler et al. .............................. | 257/347 |

OTHER PUBLICATIONS

Helm et al., "A Low Cost, Microprocessor Compatible, 18.4 um$^2$, 6–T Bulk Cell Technology For High Speed Srams," 1993 Symposium on VLSI Technology, pp. 65–66.

*Primary Examiner*—David C. Nelms
*Assistant Examiner*—Hoai Ho
*Attorney, Agent, or Firm*—Skjerven,Morrill, MacPherson, Franklin

[57] ABSTRACT

A patterned planarized insulating layer and a patterned metal layer form all local interconnects required within six-transistor SRAM cells. Supply voltage and ground lines are formed in the metal layer or in a separate layer to maximize available wiring area. Local interconnect size is maximized to increase node capacitance within the cells and reduce soft error rates, and supply voltage and ground wiring area is maximized for added cell stability and static noise margin improvement. Openings in the insulating layer for contacts, including local interconnects, bit lines, supply voltage and ground contacts, are formed with a single mask and self-aligned contact etch. Line size and spacing for the patterned metal layer is minimized because surface contours do not disturb masking and etching and all openings are formed using a single mask. The metal layer can be made thin so that the layers overlying the interconnect layer are nearly flat and so that bonding pads in the metal layer are eliminated. In one embodiment, the metal layer includes a glue layer and a plug layer and is etched to remove the plug layer from above the surface of the insulating layer. This leaves the glue layer for forming the local interconnects.

11 Claims, 10 Drawing Sheets

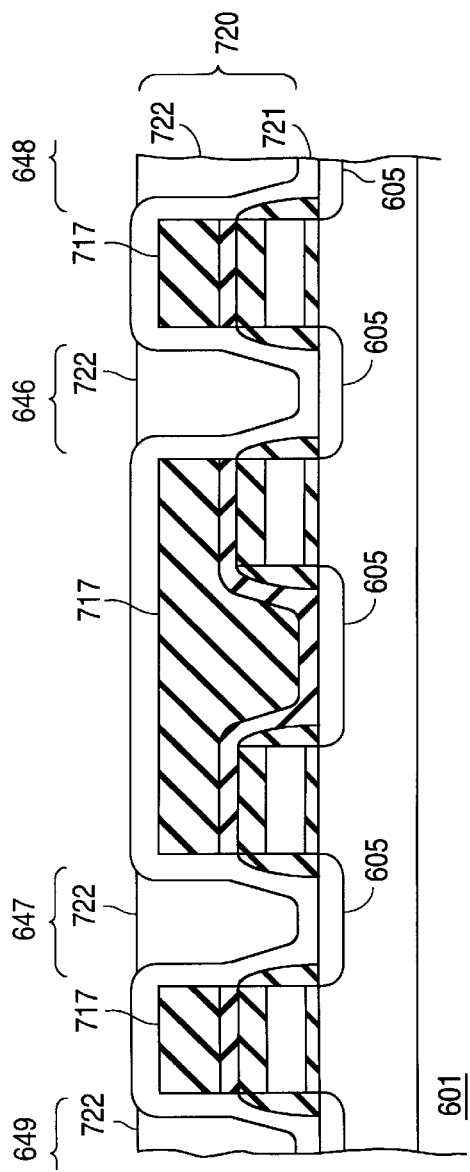
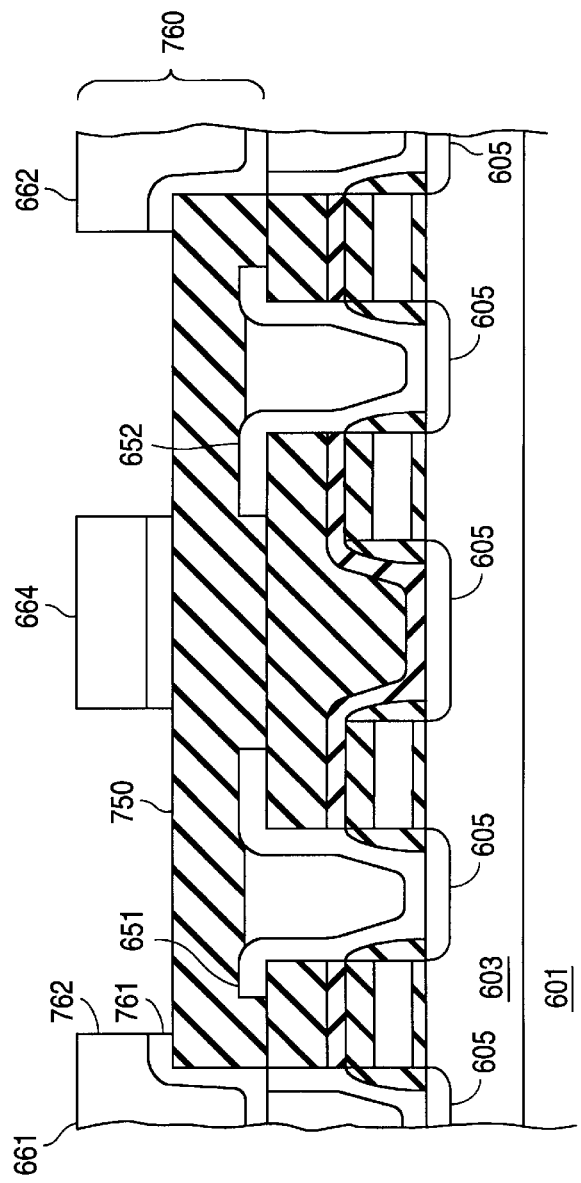
FIG. 7D
FIG. 7E

LOCAL INTERCONNECT STRUCTURE AND PROCESS FOR SIX-TRANSISTOR SRAM CELL

BACKGROUND OF THE INVENTION

1. Field of the Invention

This invention relates to SRAM and to processes for making SRAM.

2. Description of Related Art

Static random access memory (SRAM) is well known and commonly employs either four-transistor or six-transistor cells. FIG. 1 shows a six-transistor SRAM cell 100 having two pass transistors 131 and 132 which connect respective internal nodes 141 and 142 to respective bit lines 151 and 152 when a voltage on a word-line 160 is asserted. The remaining transistors in SRAM cell 100 are P-channel pull-up transistors 111 and 112 and N-channel pull-down transistors 121 and 122 which control the voltages on internal nodes 141 and 142. P channel pull-up transistors 111 and 112 are between respective nodes 141 and 142 and a supply voltage Vcc and have gates cross-coupled to opposite nodes 142 and 141 respectively. N-channel pull-down transistors 121 and 122 are between respective nodes 141 and 142 and ground (reference voltage Vss) and have gates cross-coupled to opposite nodes 142 and 141 respectively.

In steady state operation, the voltages on nodes 141 and 142 are complementary and indicate a value of a bit stored in SRAM cell 100. Voltage on node 141 being high turns off transistor 112 and turns on transistor 122 which pulls node 142 low. Voltage on node 142 being low turns off transistor 121 and turns on transistor 111 which pulls node 141 high. When voltage on node 141 is low, transistor 122 is off, and transistor 112 is on to pull node 142 high. Node 142 being high turns off transistor 111 and turns on transistor 121 to pull node 141 low.

A goal for SRAM cells in an integrated circuit is a compact layout of transistors and interconnects, but the layout must allow for anticipated alignment errors during manufacture and provide isolation between active regions. Additionally, manufacturing should achieve a high yield of operable integrated circuits using a relatively simple process that minimizes manufacturing steps to reduce cost. The layout should also provide a robust cell that is fast and not subject to errors that cause a stored value to erroneously change. A layout and manufacturing process for a six-transistor SRAM cell that achieves these goals is sought.

SUMMARY OF THE INVENTION

In accordance with an aspect of the invention, a single metal layer forms all local interconnects required within a six-transistor SRAM cell. Supply voltage (Vcc) lines and ground (Vss) lines are optionally formed in the same layer as the local interconnects or in a separate layer, for example, in a layer that forms bit lines for the SRAM cells. In either case, local interconnect size can be maximized to increase node capacitance within the cells and reduce soft error rates. With a separate layer, ground and supply voltage wiring area can be maximized for added cell stability and static noise margin improvement.

Self-aligned contacts can be formed using an insulating layer including silicon dioxide cap regions and sidewall spacers on the gates of the transistors in the memory cells and a silicon nitride layer overlying the entire structure. An etch selective of silicon nitride forms openings to active regions of transistors while the silicon dioxide cap layer and sidewall spacers protect the gates and prevent unwanted contact to the gates. The openings for all contacts to the substrate, including contacts for local interconnects, bit lines, supply voltage lines, and ground lines, can be formed with a single mask and a single self-aligned contact etch.

In one embodiment of the invention, all contact openings in the insulating layer and a conductive interconnect layer are formed after the insulating layer is planarized. A line size and spacing for the interconnects can be small because masking and etching of the interconnect layer is not disturbed by contours (and because openings are formed using a single mask). Additionally, the interconnect layer can be made thin, for example, 500 Å or less, so that the layers overlying the interconnect layer are also nearly flat.

In one embodiment, the interconnect layer includes a glue layer and a plug layer and is etched back to remove the plug layer from above the surface of the insulating layer. This leaves the glue layer for forming the local interconnects with the plug material remaining only in the openings through the insulating layer. Bonding pads in the interconnect layer for overlying bit lines, supply voltage lines, or ground lines are eliminated to provide more space for maximizing local interconnect capacitance.

BRIEF DESCRIPTION OF THE DRAWINGS

FIGS. 7A, 7B, 7C, 7D, and 7E shows cross-sections of pull-down and pass transistors at intermediate stages during manufacture of the SRAM cell of FIGS. 6A and 6B.

Use of the same reference symbols in different figures indicates similar or identical items.

DETAILED DESCRIPTION OF THE PREFERRED EMBODIMENTS

In accordance with an aspect of the invention, an SRAM (static random access memory) cell includes local interconnects that are formed from a single metal layer. The metal layer contacts all required underlying semiconductor regions such as source and drain regions of N-channel and P-channel transistors and polysilicon gate regions. The metal layer can be formed on a planarized insulating layers to allow smaller spacing between interconnects, and can be made thin to simplify patterning of overlying layers. Additionally, pads conventionally formed around openings for connecting the substrate to layers overlying the interconnect layer are eliminated to provide more space for the local interconnects. Local interconnect size and node capacitance in the SRAM cell can be increased if desired to reduce the soft error rate.

In accordance with another aspect of the invention, N islands have contacts to ground for pull-down transistors which are offset relative to supply voltage contacts to P islands for pull-up transistors. In particular, each contact to a P island is within an SRAM cell, but contacts to N islands are shared by adjacent SRAM cells. This makes gaps for isolation between N islands independent of gaps for isolation between P islands. Accordingly, isolation regions being selected for $N^+$-to-$N^+$ isolation within the SRAM cells are smaller.

Self-aligned contacts in SRAM cells in accordance with an embodiment of the invention make the SRAM cells more compact and therefore reduces the required silicon area. Embodiments of the invention include SRAM arrays with a single word-line per row or with split word-lines. Within either embodiment, sizes of local interconnects can be maximized to increase node capacitance and decrease soft errors.

Figure 1:
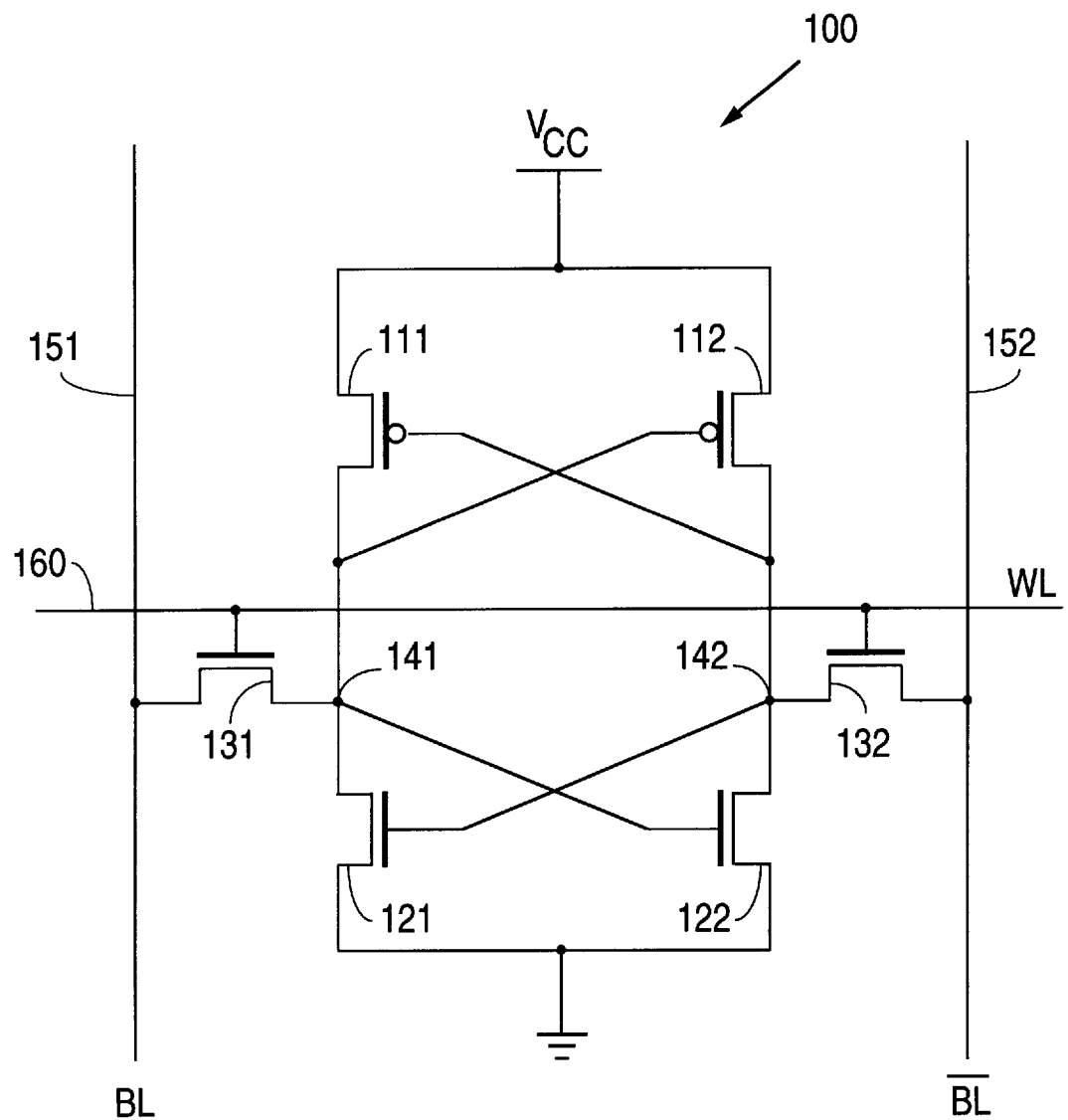
FIG. 1 shows a circuit diagram of a prior art six-transistor SRAM cell.
Figure 2A:
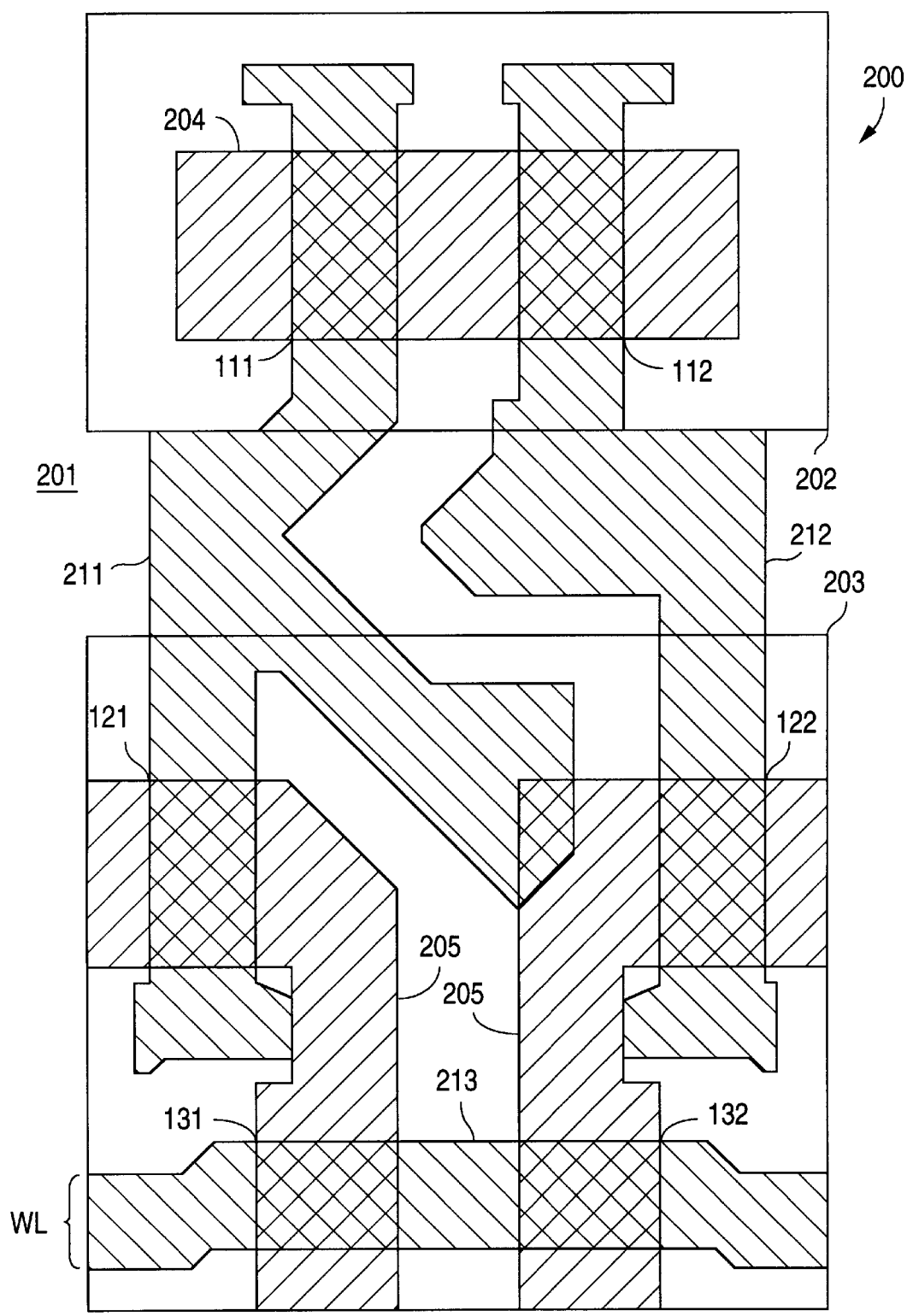
FIGS. 2A and 2 show regions formed in multiple layers of an SRAM cell in accordance with an embodiment of the invention.
Figure 2B:
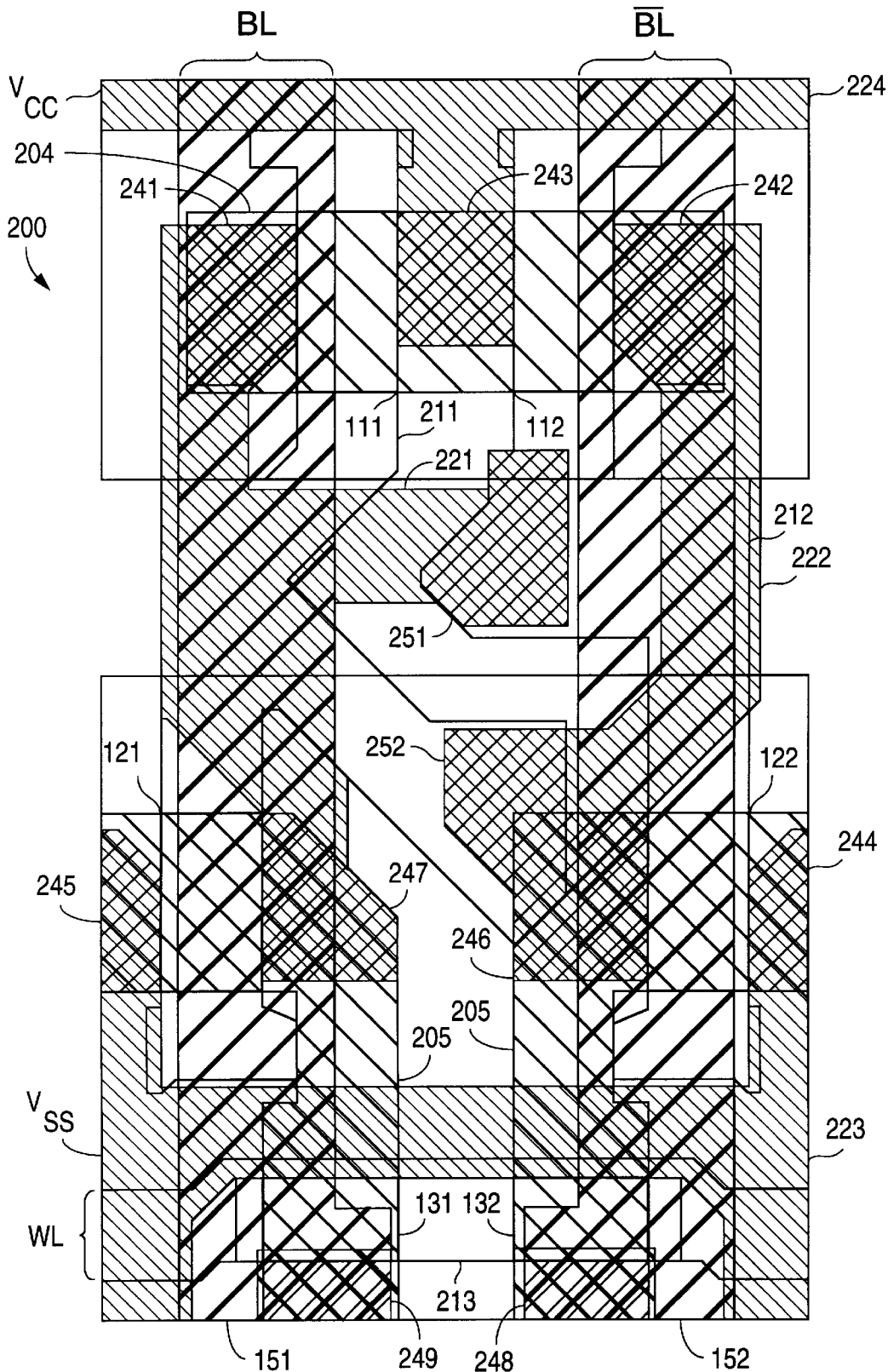

FIGS. 2A and 2B show regions in multiple layers of an SRAM cell 200 formed in accordance with an embodiment of the invention. In a typical application, SRAM cell 200 is one cell in an array containing hundreds, thousands, or millions of cells arranged in rows and columns. FIG. 2A shows regions of SRAM cell 200 formed in a silicon substrate 201 and regions of a patterned polysilicon layer overlying substrate 201. FIG. 2B additionally shows regions overlying the patterned polysilicon layer. FIGS. 3A to 3D show cross-sections of SRAM cell 200 at intermediate steps during manufacture and are describe in conjunction with FIGS. 2A and 2B.

Figure 3A:
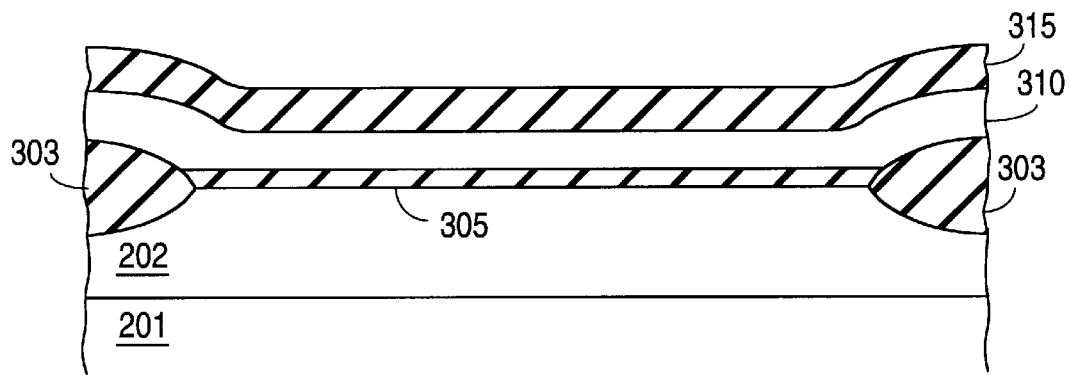
FIGS. 3A, 3B, 3C, and 3D show cross-sectional views of pull-up transistors at intermediate stages during manufacture of the SRAM cell of FIGS. 2A and 2B.

SRAM cell 200 can be manufactured with a CMOS (complementary metal oxide silicon) process. Initially, substrate 201 includes a p type doped epitaxial layer on a single crystal wafer that is masked and doped to form an n-well 202 and a p-well 203 for well known twin well isolation. Field oxide regions 303 (FIG. 3A) are then grown in a conventional matter for isolation of active elements to be formed in wells 202 and 203. As shown in FIG. 3A, a gate oxide layer 305 between 40 Å and 300 Å thick and a polysilicon layer 310 between about 800 Å and 3000 Å are formed overlying silicon substrate 201. Polysilicon layer 310 is doped to provide a conductive layer. In an exemplary process, polysilicon layer 310 is doped by in-situ doping during deposition of polysilicon layer 310 or by ion implantation or $POCl_3$ doping after formation of polysilicon layer 310. An insulating cap layer 315, for example, of silicon dioxide or silicon nitride between 2000 and 4000 Å thick is then deposited over polysilicon layer 310.

Figure 3B:
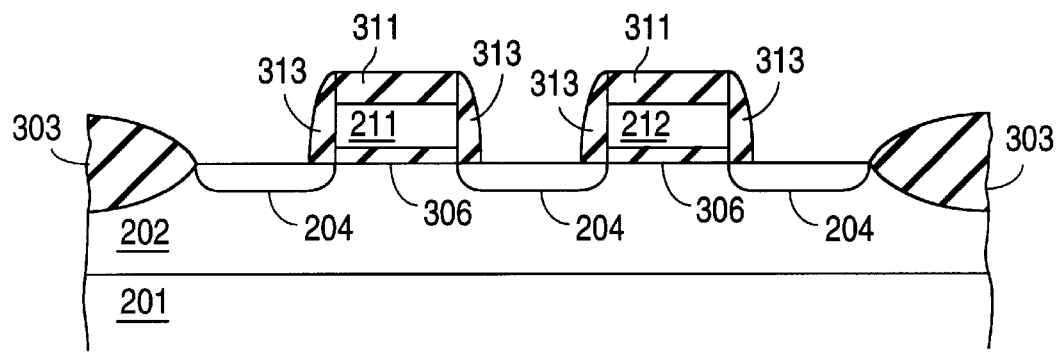

Cap layer 315, polysilicon layer 310, and gate oxide layer 305 are then patterned using a single mask. FIG. 2A shows the layout of polysilicon regions 211, 212, and 213 formed from polysilicon layer 310. FIG. 3B shows cross-sections of polysilicon regions 211 and 212, which are between cap regions 311 and insulating regions 306. Polysilicon regions 211 and 212 form the gates of respective P-channel pull-up transistors 111 and 112 having P type active regions 204 formed in N-well 202 and gates of respective N-channel pull-down transistors 121 and 122 having N type active regions 205 formed in P-well 203. Polysilicon region 213 is also between insulating gate oxide 305 and cap regions 311 and forms a portion of word-line 160 including the gates of pass transistors 131 and 132.

Polysilicon regions 211, 212, and 213 limit doping that forms source and drain regions (islands 204 and 205) for transistors 111, 112, 121, 122, 131, and 132. For example, an initial ion implantation of substrate 201 with arsenic or another P type dopant begins formation of P islands 204 which include the sources and drains of pull-up transistors 111 and 112. Regions 211, 212, and 213 also limit an initial light implantation with boron or another N type dopant that begins formation of N type islands 205 (i.e. the sources and drains of pull-down transistors 121 and 122 and pass transistors 131 and 132). During the implantations, cap regions 311 overlying the polysilicon regions protect the polysilicon regions from implants that could damage or change the conductivity of the polysilicon regions.

After the initial ion implantations, sidewall spacers 313 are formed on polysilicon regions 211, 212, and 213. One method for forming sidewall spacers 313 deposits a layer of silicon dioxide to a thickness of about 1000 Å to 5000 Å, and an unmasked anisotropic etch of the layer exposes areas of substrate 201 but leave spacers on the sidewalls of polysilicon regions 211, 212, and 213. Further N and/or P implants after formation of sidewall spacers increase dopant concentration of islands 204 and 205 and create source and drain regions that have lightly doped portions adjacent the gates (i.e. under sidewall spacers 313) for the prevention of breakdown.

Figure 3C:
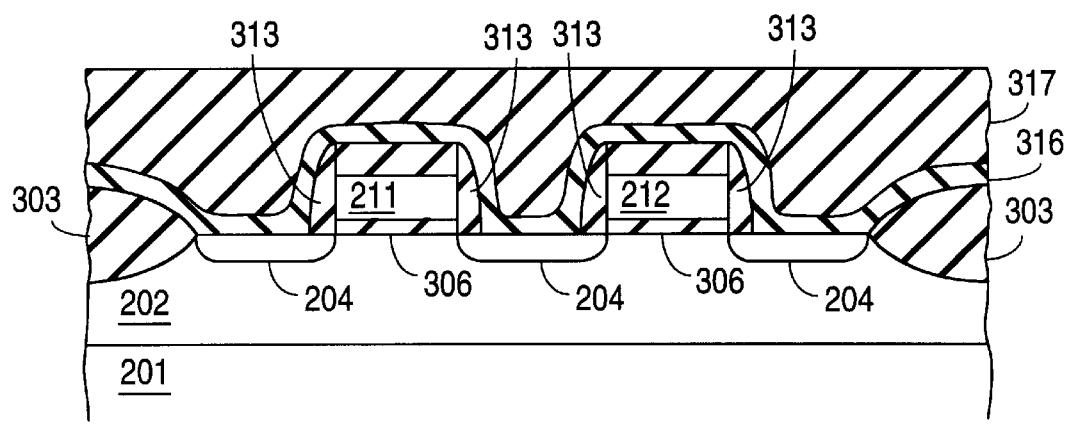

As shown in FIG. 3C, a silicon nitride layer 316 between about 500 Å and 1000 Å is deposited over the structure, and then a silicon dioxide or doped glass layer 317 is deposited to a thickness of about 6000 Å to 10,000 Å. Heating that causes glass to flow and/or polishing to planarize layer 317 provide a flat surface for subsequent layers and preferably leaves 1500 Å to 2000 Å above the highest points of layer 316. Openings 241 to 249 (FIG. 2B) for contacts are then formed through layers 317 and 316 using a single mask and a self-aligned etch process including two etch steps. The first etch is selective to the material of layer 317 and exposes regions of layer 316. The second etch is selective to the material of layer 316 and exposes regions of substrate 201, cap regions, and sidewall spacers 313 which underlie exposed areas of layer 316. Openings 241, 242, and 243 of FIG. 2B are for vias that contact sources and drains of pull-up transistors 111 and 112. Cap regions 311 and sidewall spacers 313 remain largely intact after the second selective etch and insulate polysilicon regions 211 and 212 from the adjacent contacts. Thus, contacts to P type island 204 are self-aligned, and island 204 can be smaller because tolerances for alignment errors are not required. Additionally, the locations of openings for contacts are more easily controlled because masking and etching are preformed on a planarized surface.

Openings 251 and 252 are through layers 317, 316, and cap regions 311 for contacts to polysilicon regions 211 and 212 respectively. A third etch process limited by a second mask removes a portion of cap oxide regions 311 to allow contacts to polysilicon regions 211 and 212. N type and/or P type contact implants through openings 241 to 249, 251, and 252 are performed if required to reduce contact resistance or field edge leakage.

Figure 3D:
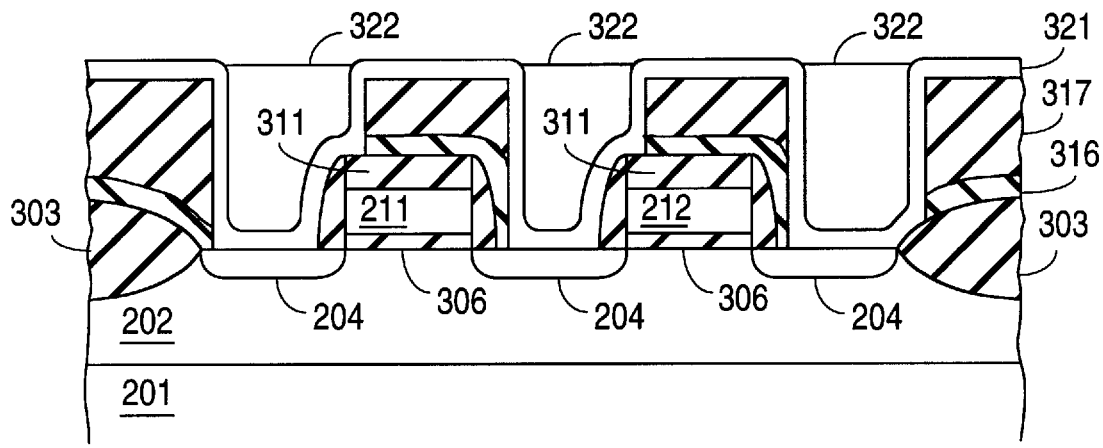

A metal layer 320 consisting of a glue layer 321 and a plug layer 322 (FIG. 3D) is deposited on insulating layer 317 and in openings 241 to 249, 251, and 252. Conventional vapor deposition or sputtering of a conductive glue material such titanium or titanium nitride forms glue layer 321 which is typically between 500 Å and 3500 Å thick and often less than about 1000 Å thick. The conductive glue material contacts and bonds to oxide layer 317 and regions of memory cell 200 exposed by openings 241 to 249, and 251 and 252. Deposition or sputtering of a plug material such as tungsten or titanium tungsten forms layer 322 which plugs remaining portions of openings 241 to 249, 251, and 252. In the embodiment of FIG. 3D, layer 322 is uniformly etched so that only glue layer 321 remains above insulating layer 317. Alternatively, an etch back is less extensive or skipped to provide a thicker metal layer.

Before patterning metal layer 320, an insulating layer 420 of, for example, silicon nitride or silicon dioxide can be deposited. Patterning layer 420 and metal layer 320 forms conductive metal regions including local cross-couple interconnects 221 and 222, a ground line 223, and a supply voltage line 224 shown in FIG. 2B. Portions of these metal regions contact substrate 201 and gate region 211 or 212. Forming all contacts and local interconnects with a single metal layer simplifies the process when compared to processes that require multiple patterned metal layers to form the desired contacts and interconnects. For example, the current process avoids multiple contact implants and multiple masks that may be required if contacts to semiconductor layers are formed from more than one metal layer.

Several features contribute to making SRAM cell 200 compact. The self-aligned contacts reduce contact areas and the gaps between structures formed from metal layer 320. Additionally, aggressive design rules for local interconnects and contacts can be employed because planarizing before forming metal layer 320 avoids difficulties associated with patterning convoluted surfaces. Further, a portion of interconnect 222 forms a compact strapping via structure that contacts portions of both polysilicon region 212 and N type island 205 within a single opening (the combination of openings 246 and 252). Strapping vias are further described in U.S. patent application Ser. No. 08/567,649, entitled "Strapping Via for Interconnecting Integrated Circuit Structures," which is incorporated by reference herein in its entirety. Additionally, isolation within memory cell 200 separates individual N type islands 205, but isolation for individual P type islands 204 is between cells. This is desirable because LOCOS isolation 303 between P type islands 204 typically must be wider than the isolation between N type regions 205 and placing isolation for the P type islands 204 between cells reduces restrictions on the internal dimension of memory cell 200.

To increase the available area for local interconnects, surface portions of vias that are not connecting to interconnects are removed during patterning of metal layer 320. Openings 248 and 249 are for connection of bit lines 151 and 152 which overlie metal layer 320. Conventionally, a pad would be formed from metal layer 320 to provide a larger area in which the contact can be formed, and ground line 223 would be separated from the pad by at least the minimum feature size of the manufacturing process. In accordance with an aspect of the invention, the portion of metal layer 320 above openings 248 and 249 is exposed to the etch process that forms interconnects 221 and 222 and ground line 223. This removes metal around openings 248 and 249 leaving a portion of layer 320 in and bounded by openings 248 and 249.

Figure 4:
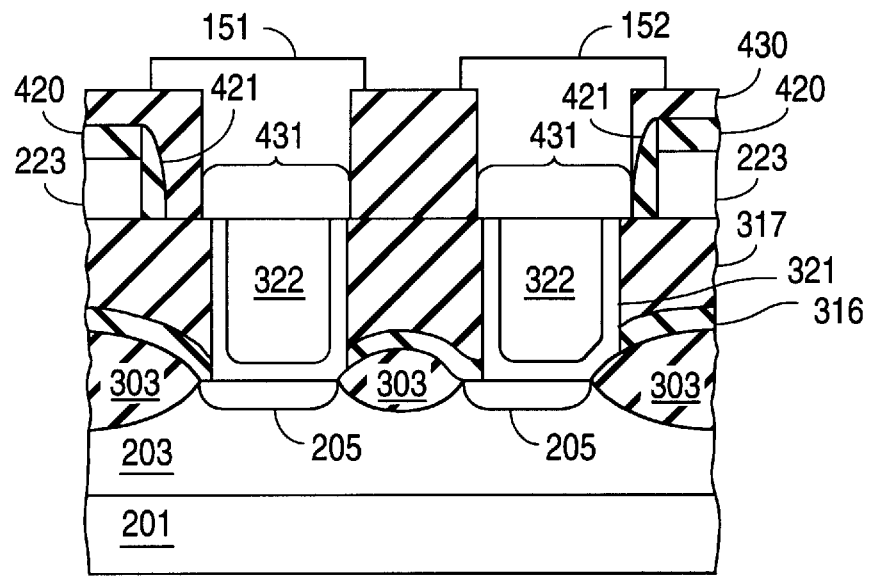
FIG. 4 shows a cross-section of bit line contacts in the SRAM cell of FIGS. 2A and 2B.

As illustrated in FIG. 4, sidewall spacers 421 of a first insulating material such as silicon nitride or silicon dioxide are formed on the local interconnects after patterning metal layer 320, and an insulating layer 430 of a second insulating material such as silicon dioxide or doped glass is formed overlying the local interconnects. An etch selective to the material in insulating layer 430 forms openings through insulating layer 430 for bit line contacts, word-line contacts, supply voltage contacts, and ground line contacts. FIG. 4 shows a cross-section through bit line contacts to regions 205 of FIG. 2B. As described above, patterning of layer 320 leaves no bonding pads above insulating layer 317 around plugs contacting island 205 and allows ground line 223 to be closer to the bit line contacts. The bit line contacts are self-aligned since encapsulation of ground line 223 by caps 420 and spacers 421 protects ground line 223 from being exposed by misalignment of openings 431. A second metal plug layer optionally preceded by a glue layer fills openings 431. The second metal layer is then patterned to form bit lines 151 and 152. In embodiments, where metal regions 221 to 224 are relatively thin, e.g. less than about 1000 Å, patterned metal layer 320 does not cause the topology of layer 430 to hinder formation of openings 431 or patterning of the second metal layer.

An alternative embodiment of the invention has three separate metal layers, one for local interconnects and two for ground lines, supply lines, and bit lines. With more metal layers, the size of interconnects 211 and 212 can be further increased to increase internal node capacitance and reduce soft error rate (SER). The size of the ground and supply lines can also be maximized to improve stability and static noise margin.

Figure 5:
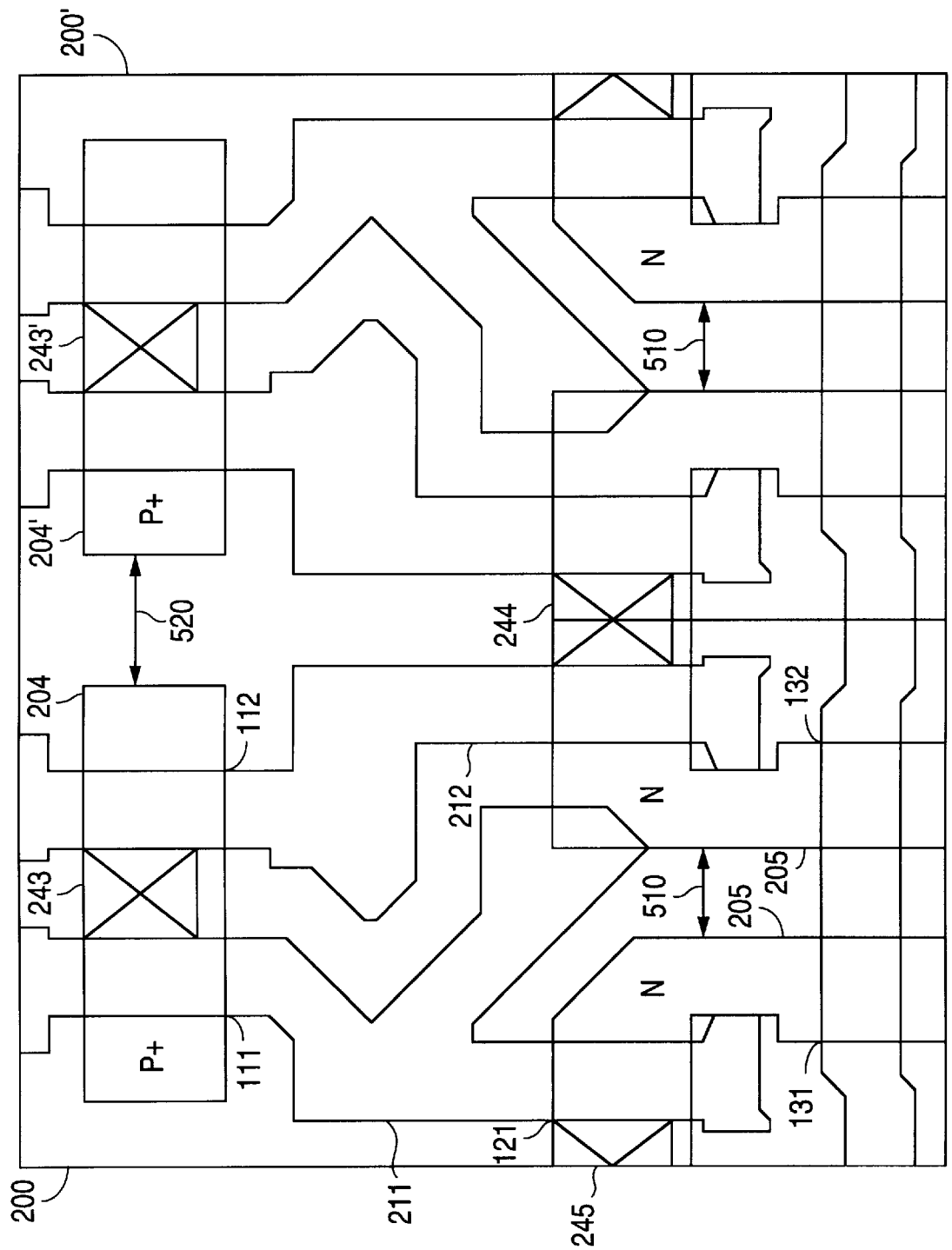
FIG. 5 shows two SRAM cells from a memory array in accordance with an embodiment of the invention.

Features of the layout shown in FIG. 2B that reduces SRAM cell area are the relative offsets between P islands 204 and between N islands 204. As shown in FIG. 5, self-aligned via 243 which connects supply voltage line 224 to P island 204 (the shared source of P-channel pull-up transistors 111 and 112) is inside SRAM cell 200 and isolation 303 between adjacent P islands 204 and 204' is between memory cells 200 and 200'. In contrast, vias 244 and 245 which contact the sources of N-channel pull-down transistors 122 and 121 respectively are shared by and between adjacent cells and isolation between islands 205 is inside memory cell 200. Spacing 510 required for isolation between N island 205 inside SRAM cell 200 is thus independent of spacing 520 between P islands 204 and 204' which permits greater layout freedom and allows more compact pull-down and pass transistor structures. Spacing 510 for isolation of N type regions is typically less than the spacing 520 required for isolation of P type regions.

Figure 6A:
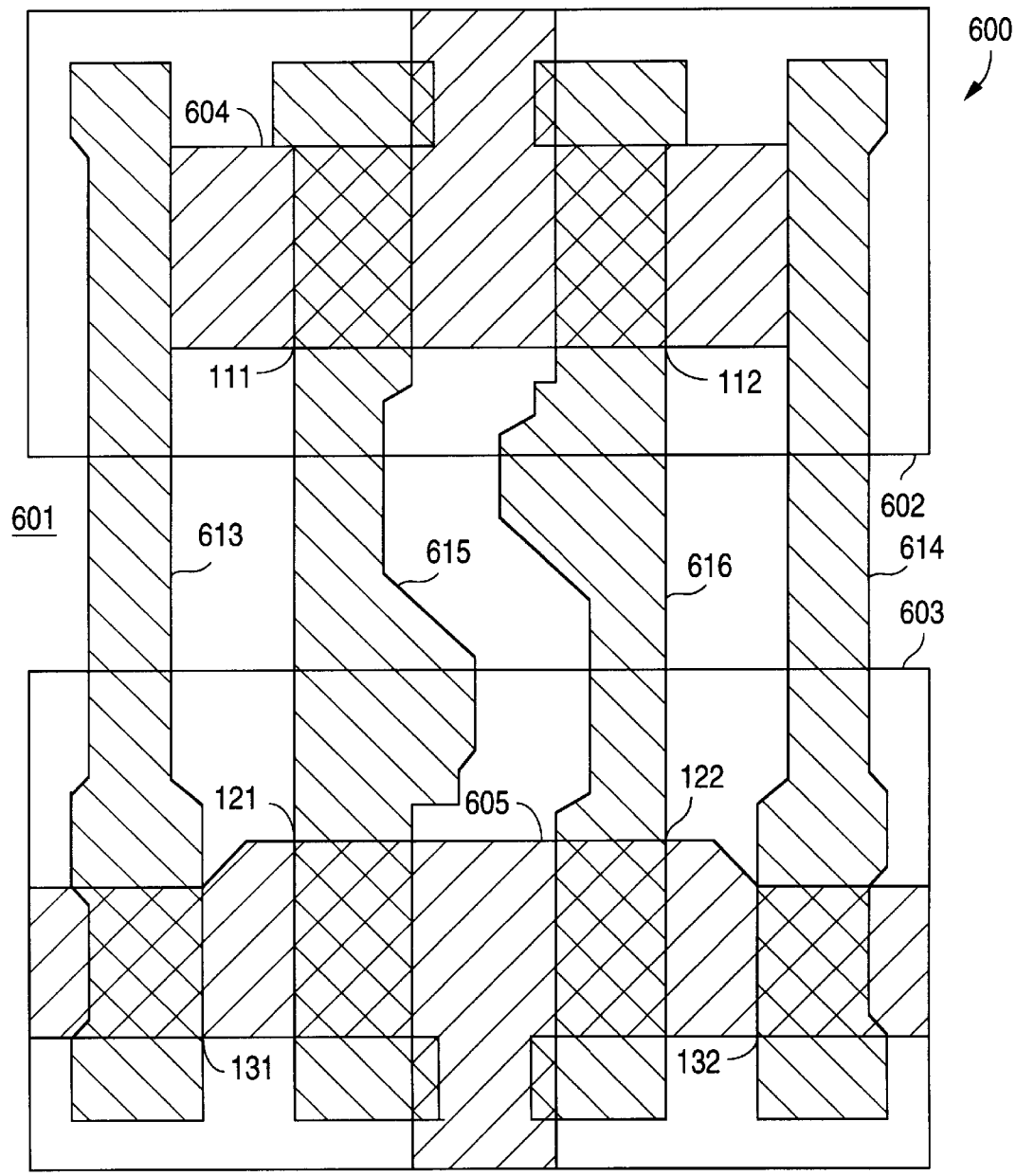
FIGS. 6A and 6B show regions formed in multiple layers of a split-word-line SRAM cell in accordance with an embodiment of the invention.
Figure 6B:
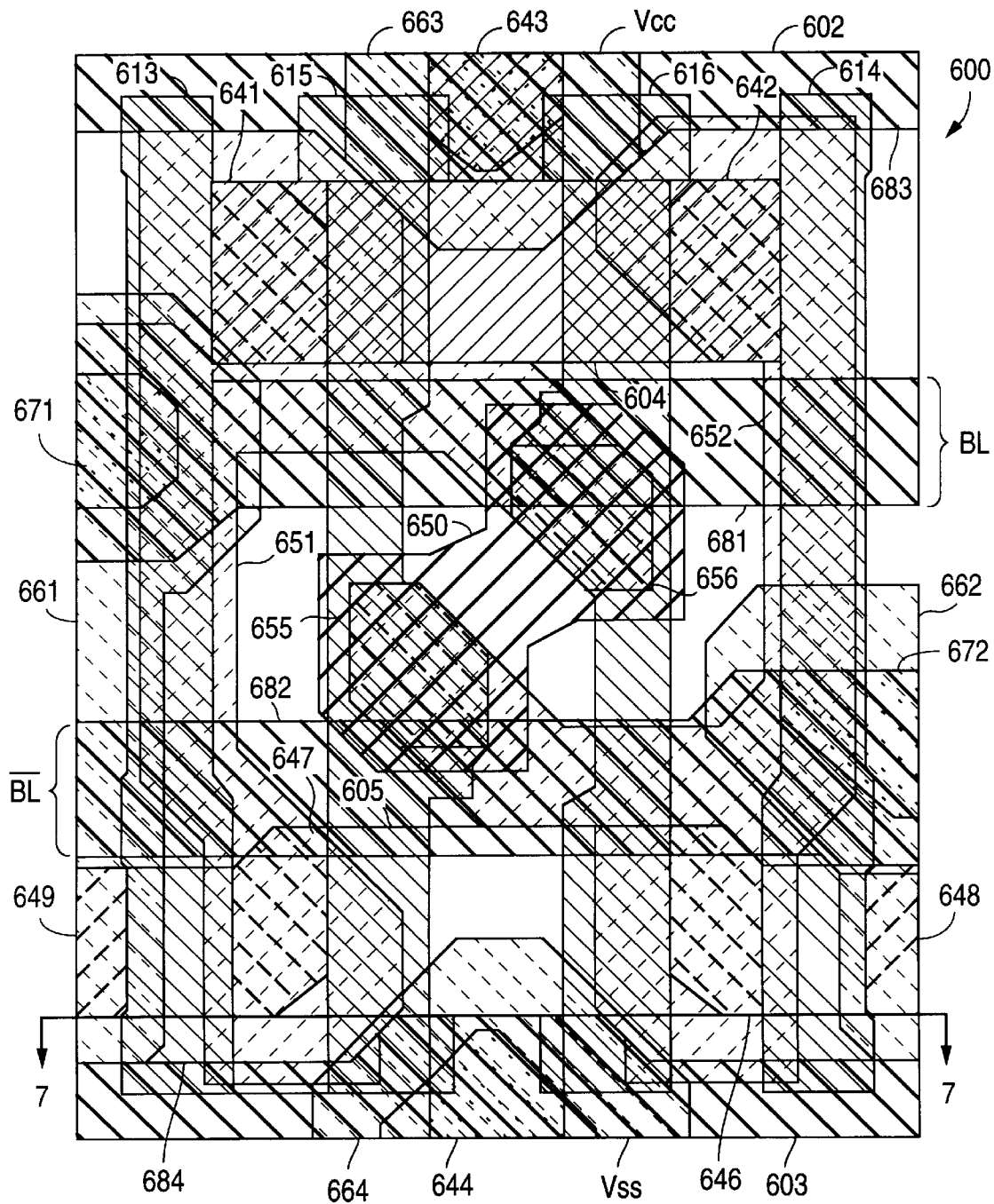

FIGS. 6A and 6B show regions in multiple layers of a six-transistor split-word-line SRAM cell 600 formed in accordance with another embodiment of the invention. FIGS. 7A to 7E, which are described concurrently with FIGS. 6A and 6B, show cross-sectional views during manufacturing of a portion of SRAM cell 600 indicated by a line 7—7 in FIG. 6B. Formation of SRAM cell 600 is by a similar process to that described above in regard to SRAM cell 200 of FIGS. 2A, 2B, and 3A to 3D except that SRAM cell 600 is formed using a triple metal process that adds a metal layer not required for SRAM cell 200. The reader is referred to the above descriptions of FIGS. 2A, 2B, and 3A to 3D for additional details of a process for forming the initial layers of SRAM cell 600.

Figure 7A:
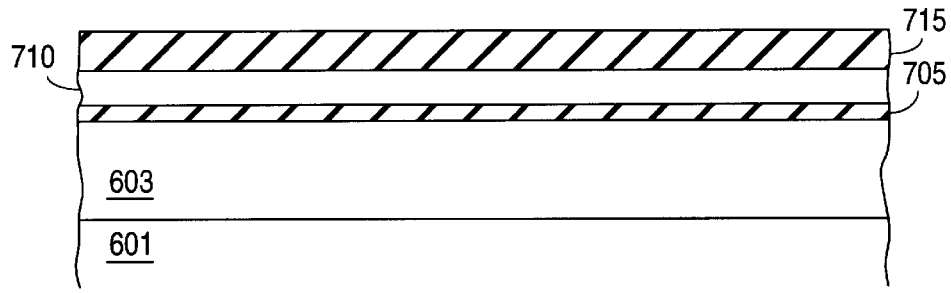

Initially, an n-well 602 for p-channel transistors 111 and 112 and a p-well 603 for n-channel transistors 121, 122, 131, and 132 are formed in a silicon substrate 601. After which a gate oxide layer 705, a conductive polysilicon layer 710, and an insulating cap layer 715 are formed on the surface of substrate 601 as shown in FIG. 7A. The three layers 705, 710, and 715 are patterned using the same mask to form polysilicon gate regions 613 to 616 shown in FIG. 6A. Regions 613 and 614 are the portions of a split word-line for SRAM cell 600 and respectively form the gates of n-channel pass transistors 131 and 132. Region 615 forms the gates of n-channel pull-down transistor 121 and p-channel pull-up transistor 111. Region 616 forms the gates of n-channel pull-down transistor 122 and p-channel pull-up transistor 112.

Figure 7B:
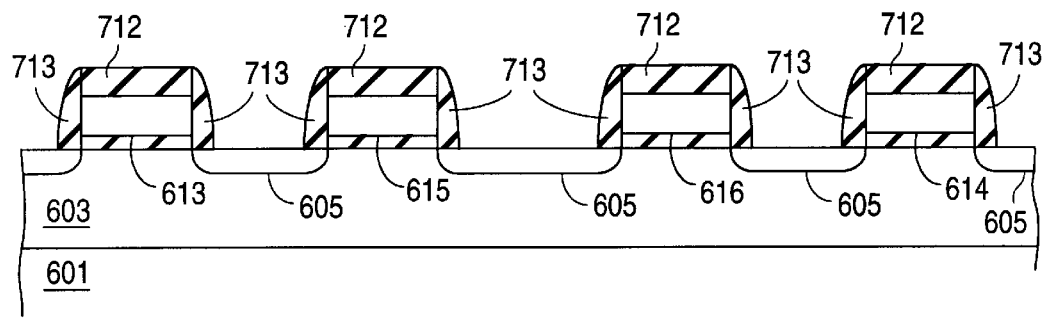

After polysilicon layer 710 is patterned, drain and source implants are performed and silicon dioxide sidewall spacers 713 are formed on polysilicon regions 613 to 616. As in SRAM cell 200, a light doping may precede and a heavier doping follow formation of sidewall spacers 713. FIG. 7B shows N island 605 which is in p-well 603 and forms the sources and drains of transistors 121, 122, 131, and 132. P island 604 in n-well 602 forms the sources and drains of p-channel transistors 111 and 112.

Figure 7C:
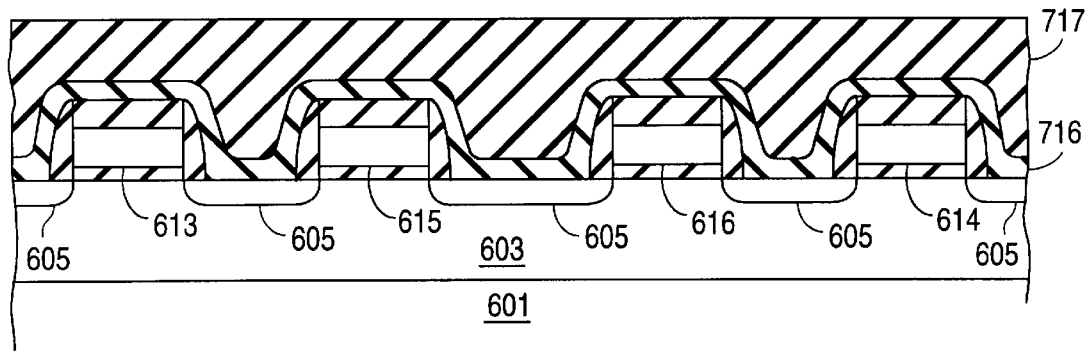

FIG. 7C shows a silicon nitride layer 716 and a planarized silicon dioxide or glass layer 717 which enable formation of self-aligned contacts to regions of substrate 601. Openings 641 to 644 and 647 to 649 of FIGS. 6B and 7D are for contacts to regions 604 or 605 of substrate 601 and are formed using two etches and a single mask. The first etch is selective of silicon dioxide layer 717 and exposes portions of silicon nitride layer 716. The second etch removes the exposed portions of silicon nitride layer 716 to expose regions of substrate 601. Portions of cap layer 715 and sidewall spacers 713 are largely intact after the second etch so that misalignment of the mask used during the two etch steps does not expose any of polysilicon regions 613 to 616.

Openings 655 and 656 are for contacts to polysilicon regions 615 and 616 respectively. Three etches form openings 655 and 656. The first two etches remove portions of layers 717 and 716 and are described above for openings 641 to 644 and 646 to 649. The third etch removes portions of cap layer 715 from polysilicon regions 615 and 616. A second mask protects silicon dioxide in openings 641 to 644 and 646 to 649 and insulating layer 717 during the third etch step. Region 650 in FIG. 6B shows the area in SRAM cell 600 exposed to the third etch.

After forming openings 641 to 644, 646 to 649, 655 and 656, photoresist is removed, and a first metal layer 720 is formed. As shown in FIG. 7D, first metal layer 720 includes a glue layer 721 that adheres to silicon dioxide and a plug layer 722 that fills the remaining portions of the openings. Metal layer 720 is etched back to reduce overall thickness and in the embodiment of the invention illustrated in FIG. 7D, is etched back to expose the portions of glue layer 721 that lie on the surface of insulating layer 717.

Patterning the first metal layer forms local interconnects 651 and 652. Local interconnect 651 forms node 141 and connects polysilicon region 616 (the gates of transistors 112 and 122) to the drains of transistors 111 and 121. Local interconnect 652 forms node 142 and connects polysilicon region 615 (the gates of transistors 111 and 121) to the drains of transistors 112 and 122. The mask used during patterning of first metal layer 720 covers only local interconnects 651 and 652, and the etch of metal layer 720 is of controlled duration to remove metal layer 720 from the planarized surface of insulating layer 717 but leave metal in the openings through insulating layer 717. Accordingly, metal in openings 643, 644, 648, and 649 is confined to those openings, and no pads extend around openings 643, 644, 648, and 649. Local interconnects 651 and 652 can be maximized in size because a minimal area of the first metal layer is used for purposes other than local interconnects 651 and 652. Additionally, aggressive design rules can be used for local interconnects 651 and 652 because the first metal layer is substantially flat.

An insulating layer 750 is formed over patterned metal layer 720 as shown in FIG. 7E. Insulating layer 750 is relatively flat because metal layer 720 is thin and insulating layer 717 was planarized. Insulating layer 750 may additionally be planarized to prove a flatter surface. The flat surface of insulating layer 750 simplifies alignment of openings in layer 720 with openings 643, 644, 648 and 649.

A second metal layer 760, which includes a glue layer 761 and a plug layer 762, is formed and patterned to form pads 661 to 664 for connection to bit lines 681 and 682, a supply voltage line 683, and a reference voltage line 684 which are formed in a third metal layer. Contact pads 663 and 664 increase the capacitance of supply voltage line 683 and ground line 684 and improve cell stability. Contact pads 661 and 662 offset third layer metal bit line contacts from the first layer metal bit line contacts because openings 649 and 648 are in line along a column of an array containing SRAM cell 600.

The third metal layer is formed on an insulating layer having openings 671 to 674 which lead to pads 661 to 664 respectively. The third metal layer is then patterned to form bit lines 681 and 682, supply line 683, and reference (or ground) line 684, all of which run parallel to columns of the array containing SRAM cell 600. An IC containing SRAM cell 600 can then be conventionally completed and packaged.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. A memory cell comprising:
   a first n-channel transistor;
   a second n-channel transistor;
   a first p-channel transistor;
   a second p-channel transistor;
   an insulating layer formed overlying the first and second n-channel transistors and the first and second p-channel transistors; and
   a patterned metal layer that is on the insulating layer and contacts the first and second n-channel transistors and the first and second p-channel transistors via openings through the insulating layer, wherein the patterned metal layer comprises a glue layer and a plug material, the plug material being confined to the openings through the insulating layer so that portions of the metal layer that overlie the insulating layer consist of the glue layer.

2. The memory cell of claim 1, further comprising:
   a first pass transistor coupled to the drain of the first n-channel transistor; and
   a second pass transistor coupled to the drain of the second n-channel transistor.

3. The memory cell of claim 1, wherein the insulating layer has a planarized surface on which the metal layer is formed.

4. The memory cell of claim 2, wherein the metal layer further comprises a plug that contacts a terminal of the first pass transistor via an opening through the insulating layer, wherein the plug is confined to the opening and does not extend onto a major surface of the insulating layer.

5. The memory cell of claim 4, wherein the metal layer further comprises a plug that contacts a source of the first n-channel transistor via an opening through the insulating layer, wherein the plug is confined to the opening and does not extend onto a major surface of the insulating layer.

6. The memory cell of claim 5, wherein the metal layer further comprises a plug that contacts a source of the first p-channel transistor via an opening through the insulating layer, wherein the plug is confined to the opening and does not extend onto a major surface of the insulating layer.

7. The memory cell of claim 4, further comprising:

a second insulating layer that overlies the metal layer; and a bit line that contacts the plug via an opening through the second insulating layer, the plug providing an electrical connection between the bit line and the first pass transistor.

8. The memory cell of claim 7, wherein the bit line is on a surface of the second insulating that has a contour according to the metal layer, which underlies the second insulating layer.

9. The memory cell of claim 1, wherein the metal layer further comprises a plug that contacts a source of the first n-channel transistor via an opening through the insulating layer, wherein the plug is confined to the opening and does not extend onto a major surface of the insulating layer.

10. The memory cell of claim 1, wherein the metal layer further comprises a plug that contacts a source of the first p-channel transistor via an opening through the insulating layer, wherein the plug is confined to the opening and does not extend onto a major surface of the insulating layer.

11. The memory cell of claim 1, wherein the metal layer further comprises:

a first region that electrically connects gates of the first n-channel transistor and the first p-channel transistor to drains of the second n-channel transistor and the second p-channel transistor; and a second region that electrically connects gates of the second n-channel transistor and the second p-channel transistor to drains of the first n-channel transistor and the first p-channel transistor.

* * * * *